United States Patent [19]

Watkins et al.

[11] Patent Number: 4,780,894

[45] Date of Patent: Oct. 25, 1988

[54] N-BIT GRAY CODE COUNTER

[75] Inventors: Daniel Watkins, Saratoga; Jimmy Wong, Cupertino, both of Calif.

[73] Assignee: LSI Logic Corporation, Milpitas, Calif.

[21] Appl. No.: 40,451

[22] Filed: Apr. 17, 1987

[51] Int. Cl.$^4$ .............................................. H03K 21/20
[52] U.S. Cl. .......................................... 377/34; 377/51; 377/49
[58] Field of Search ................. 377/34, 51, 49, 33, 377/108

[56] References Cited

U.S. PATENT DOCUMENTS

| | | | |
|---|---|---|---|
| 3,076,601 | 2/1963 | Goetz | 377/34 |
| 3,663,804 | 5/1972 | Newell | 377/33 |
| 3,942,171 | 3/1976 | Haraszti et al. | 377/33 |
| 4,703,495 | 10/1987 | Bereznak | 377/34 |

*Primary Examiner*—John S. Heyman
*Attorney, Agent, or Firm*—Alan H. MacPherson; Nathan N. Kallman; Paul J. Winters

[57] ABSTRACT

A Gray code counter employs modules of binary bits to form expressions or numbers. The count is sequenced from one expression to the next by changing only one binary bit in one location of an expression. The Gray code counter can be an incrementing counter or an increment/decrement counter. The counter can operate with expressions of several bits, and employs a minimal number of D type flip-flops and logic gates.

31 Claims, 7 Drawing Sheets

N-BIT GRAY CODE COUNTER

BACKGROUND OF THE INVENTION

1. Field of the Invention

This invention relates to Gray code counters and in particular to a Gray code counter that employs a modular type of sequencing.

2. Description of the Prior Art

Conventional electrical counters are devices characterized by a state representative of a number. When the counter receives an appropriate signal, the number represented is increased or decreased by unity or by an arbitrary constant. The counter is capable of bringing the number to a specified value.

Digital computers and programmable controllers use counters to control the sequence and execution of program steps. An instruction type counter is utilized to indicate the location of the next computer instruction to be interpreted. Decoding counters are employed to give an output indication at a predetermined count. The output of the decoder is used to initiate a stepping function and to reset the counter. Conventional decoding counters are known to experience glitches, particularly when there is more than a one bit change from one number or expression to the next.

In the past, Gray code counters have been used, particularly for applications such as the transmission of telemetry data. The Gray code is a binary code in which sequential numbers are represented by binary expressions, each of which differs from the preceding expression by one bit in one place only. The Gray code has an advantage in providing a relatively simple decoding operation with glitch-free decoded outputs. However, Gray code counters were limited in use because they generally required more logic gates than other conventional counters, which caused undesirable propagation delay with resultant degradation in performance. Also prior art Gray code counters required JK flip-flops and NOR gates which added to the complexity and cost of the counter. In addition, when processing numbers or expressions each having more than four bits, for example, Gray code counters were relatively difficult to design. Complex equations representing expressions or states of the counter were required to define the counting sequence. Furthermore, it was found to be difficult to provide a decrementing feature in Gray code counters, and increment/decrement Gray code counters were not attempted or implemented.

SUMMARY OF THE INVENTION

An object of this invention is to provide a Gray code counter that affords substantially glitch-free signal decoding and improved performance.

Another object of this invention is to provide a Gray code counter that uses less gating circuits than conventional prior art Gray code counters and without the need for expensive JK flip-flops.

Another object is to provide a Gray code counter that implements an increment/decrement feature.

A further object is to provide an algorithm that simplifies the logic required to implement a Gray code counter incorporating the modular concept of this invention.

The Gray code counter of this invention, wherein binary expressions are processed in a sequence, comprises a first logic circuit for providing a modular output of two binary bits and an increment signal; a carry logic circuit coupled to the output of said first logic circuit for receiving said two binary bits and said increment signal; and a second logic circuit coupled to said carry logic circuit for receiving a carry signal and for providing a modular output consisting of a plurality of binary bits, so that said modular outputs from said first and second logic circuits are combined to form a binary bit expression for each state of said counter.

In accordance with this invention, a Gray code counter employs modules or boundary blocks, each boundary block consisting of n binary bits. The boundary blocks form a number or expression for each state of the Gray code counter sequence. A logic circuit increments or decrements one binary bit at one place in the number or expression representing a state of the counter in response to a carry signal generated by a carry logic circuit. A clock signal controls the timing of the counter sequence as the counter counts up or counts down to the next state or expression. The counting sequence for each module is controlled by logic circuits in accordance with logic equations that define the incrementing and decrementing functions and the carry logic function.

DESCRIPTION OF THE DRAWINGS

The invention will be described in detail with reference to the drawing in which.

DETAILED DESCRIPTION OF THE INVENTION

Figure 1:
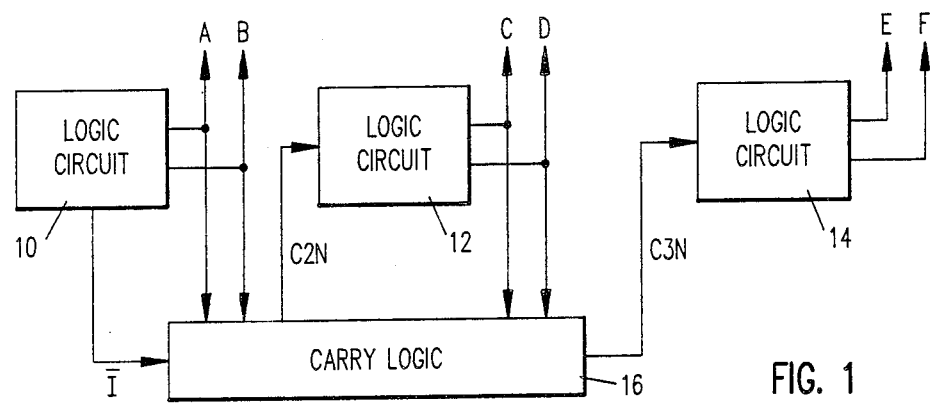
FIG. 1 is a block circuit diagram of a six bit Gray code counter, illustrating the use of three modules or boundary blocks to implement the Gray code sequence.

With reference to FIG. 1, a six bit Gray code counter includes a logic circuit 10, a logic circuit 12, and a logic circuit 14, each coupled to a carry logic circuit 16. In this embodiment, each of the logic circuits 10, 12 and 14 stores and processes a module or building block of two bits each, which for any given state of counter, form a six bit expression or number representing the state of the counter. The two bits of the module processed by logic circuit 10 are designated as A and B, or their complements $\overline{A}$ and $\overline{B}$, A or $\overline{A}$ being the least significant bit or digit. Similarly, logic circuit 12 stores and processes a module of two bits designated as C and D, or $\overline{C}$ and $\overline{D}$. The logic circuit 14 stores and processes a module or building block formed by bits E and F, or $\overline{E}$ and $\overline{F}$, F and $\overline{F}$ being the most significant bit or digit.

Thus, for a given state of the counter, the three modules of two bits each form an expression of six bits. As the counter is sequenced, one bit at one location of each expression is changed. A typical counting sequence thus is as follows:

| Counting Sequence Circuits | | | | | |
|---|---|---|---|---|---|
| 14 | | 12 | | 10 | |
| F | E | D | C | B | A |
| 0 | 0 | 0 | 0 | 0 | 0 |
| 0 | 0 | 0 | 0 | 0 | 1 |
| 0 | 0 | 0 | 0 | 1 | 1 |
| 0 | 0 | 0 | 0 | 1 | 0 |
| 0 | 0 | 0 | 1 | 1 | 0 |
| 0 | 0 | 0 | 1 | 1 | 1 |
| 0 | 0 | 0 | 1 | 0 | 1 |
| 0 | 0 | 0 | 1 | 0 | 0 |
| 0 | 0 | 1 | 1 | 0 | 0 |
| 0 | 0 | 1 | 1 | 0 | 1 |
| 0 | 0 | 1 | 1 | 1 | 1 |
| 0 | 0 | 1 | 1 | 1 | 0 |
| 0 | 0 | 1 | 0 | 1 | 0 |
| 0 | 0 | 1 | 0 | 1 | 1 |
| 0 | 0 | 1 | 0 | 0 | 1 |
| 0 | 0 | 1 | 0 | 0 | 0 |
| 0 | 1 | 1 | 0 | 0 | 0 |
| 0 | 1 | 1 | 0 | 0 | 1 |
| . | . | . | . | . | . |
| . | . | . | . | . | . |
| . | . | . | . | . | . |

To accomplish the desired counting sequence, the logic circuit 10 processes bits A and B, or $\overline{A}$ and $\overline{B}$, to provide sequential modules as follows:

| Counting Sequence of Circuit 10 | | |
|---|---|---|
| B | A | |
| 0 | 0 | |
| 0 | 1 | - -increment |
| 1 | 1 | |
| 1 | 0 | |
| 1 | 0 | |
| 1 | 1 | |
| 0 | 1 | - -decrement |
| 0 | 0 | |
| 0 | 0 | |
| . | . | |
| . | . | |

The sequence includes an incrementing function and a decrementing function that alternate after every fourth expression. Logic circuit 10 thus counts up for four consecutive modules and then counts down for the next four consecutive modules, and repeats the count up and count down in seriatim. Since the module of logic circuit 10 includes the least significant bit, it receives no output from the carry logic 16.

The counting sequence for logic circuit 12 follows a similar type of progression of change as that followed by logic circuit 10, but the bit change occurs after every four expressions or states of the counter. Each module is held for four states before a count up or count down occurs. The logic circuit 12 includes a Hold function that maintains the value of the bits of a module for four consecutive expressions.

The counting sequence for logic circuit 14 is illustrated as follows:

| Counting Sequence of Circuit 14 | | | |
|---|---|---|---|
| | F | E | |
| | 0 | 0 | |
| | 0 | 1 | - -increment |
| | 1 | 1 | |
| | 1 | 0 | |
| Reset | 0 | 0 | |
| | 0 | 1 | - -increment |
| | 1 | 1 | |
| | 1 | 0 | |
| Reset | 0 | 0 | |

Logic circuit 14 incorporates a Reset function after each sequence of four modules and repeats the sequence of four modules after each Reset. Each building block or module is incremented in the counting sequence after a Reset.

During operation of the Gray code counter of this invention, the logic circuit 10 provides an increment signal to the carry logic circuit 16, which in turn provides a carry signal to logic circuits 12 and 14. The logic circuits are timed by a clock signal which is applied to each of the logic circuits to initiate the increment or decrement of the expression present in the counter.

Figure 2:
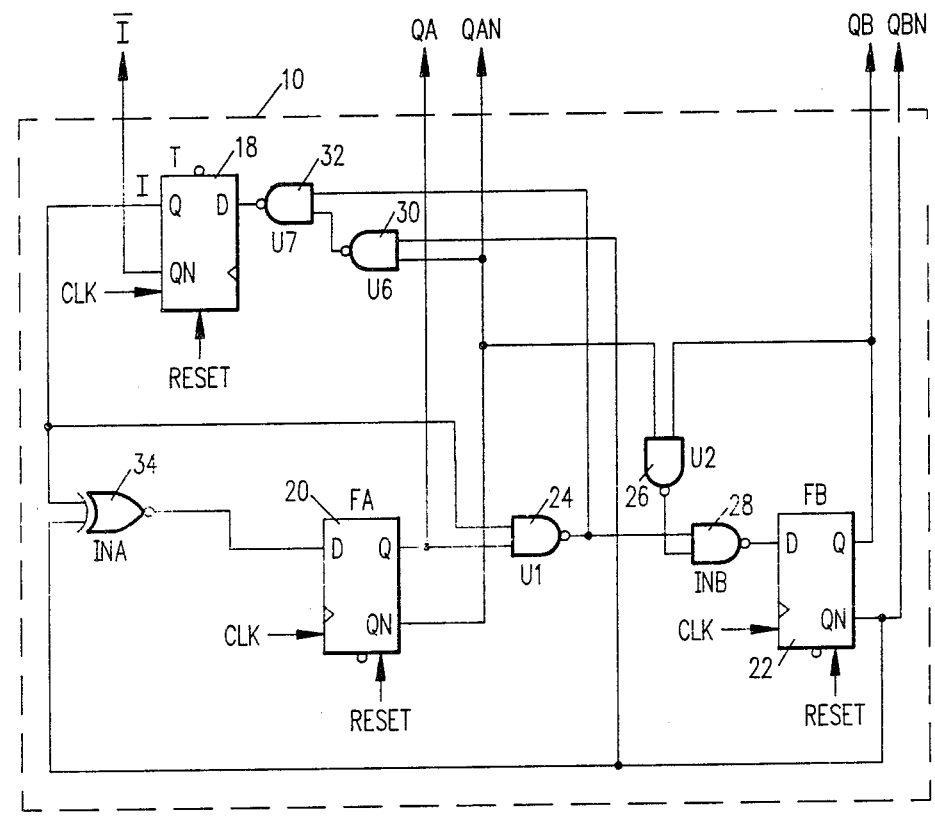
FIG. 2 is a schematic diagram of a logic circuit such as employed in FIG. 1 for generating the least significant boundary block of two bits.

FIG. 2 is a schematic and block diagram of a logic circuit 10, such as utilized in the six bit counter of FIG. 1. Initially, all the D flip-flops 18, 20 and 22 of the circuit 10 are reset so that the two bit module has two bits with values of 0-0. The following state table indicates the states and outputs of the logic blocks of FIG. 2 progressing from the initialization state O as each timing clock is applied to the D flip-flops 18, 20 and 22:

| Clock Unit | QB | $\overline{QB}$ | QA | $\overline{QA}$ | T | INA | u1 | u2 | INB | u6 | u7 | |
|---|---|---|---|---|---|---|---|---|---|---|---|---|
| 0 | 0 | 1 | 0 | 1 | 1 | 1 | 1 | 1 | 0 | 0 | 1 | |
| 1 | 0 | 1 | 1 | 0 | 1 | 1 | 0 | 1 | 1 | 1 | 1 | - -increment |
| 2 | 1 | 0 | 1 | 0 | 1 | 0 | 0 | 1 | 1 | 1 | 1 | |
| 3 | 1 | 0 | 0 | 1 | 1 | 0 | 1 | 0 | 1 | 1 | 0 | |

-continued

| Clock Unit | QB | $\overline{QB}$ | QA | $\overline{QA}$ | I | INA | u1 | u2 | INB | u6 | u7 | |
|---|---|---|---|---|---|---|---|---|---|---|---|---|
| 4 | 1 | 0 | 0 | 1 | 0 | 1 | 1 | 0 | 1 | 1 | 0 | |
| 5 | 1 | 0 | 1 | 0 | 0 | 1 | 1 | 1 | 0 | 1 | 0 | --decrement |
| 6 | 0 | 1 | 1 | 0 | 0 | 0 | 1 | 1 | 0 | 1 | 0 | |
| 7 | 0 | 1 | 0 | 1 | 0 | 0 | 1 | 1 | 0 | 0 | 1 | |
| 8 | 0 | 1 | 0 | 1 | 1 | 1 | 1 | 1 | 0 | 0 | 1 | |
| . | . | . | . | . | . | . | . | . | . | . | . | |
| . | . | . | . | . | . | . | . | . | . | . | . | |
| . | . | . | . | . | . | . | . | . | . | . | . | |
| Cycle repeats. | | | | | | | | | | | | |

QB and QBN (or Q$\overline{B}$) are the complementary output signals from flip-flops 22; QA and QAN (or Q$\overline{A}$) are the complementary output signals from flip-flop 10; I and $\overline{I}$ are the complementary output signs from flip-flop 18; INA is the state of exclusive NOR gate 34; u1 is the state of NAND gate 24; u2 is the state of NAND gate 26; INB is the state of NAND gate 28; u6 is the state of NAND gate 30; and u7 is the state of NAND gate 32. For each clock interval, the states or two-bit module output is QA and QB (or their complements QAN and QBN) which respectively correspond to the A and B outputs of logic circuit 10 in FIG. 1.

In operation, the increment signal I from flip-flop 18 is directed to the exclusive NOR gate 34, which provides the INA output to the D input of flip-flop 20. Upon appearance of the clock, flip-flop 20 produces an output that is the complement of the present state, i.e., QA or QAN. The increment signal I is also passed through NAND gate 24, which receives the QA output from flip-flop 20. The output of NAND gate 24 is applied to NAND gate 28, which also receives an output from NAND gate 26. The gate 26 is tied to the QN output terminal of flip-flop 20. The output of NAND gate 28 is provided to the D terminal of the flip-flop 22. NAND gate 30 receives the outputs from the QN terminal of flip-flop 22 and the QN terminal of flip-flop 20, and provides its output to NAND gate 32, which also receives the output signal of NAND gate 24. The state of flip-flop 18 is controlled by the output of gate 32 to its D input terminal and the clock signal.

Figure 3:
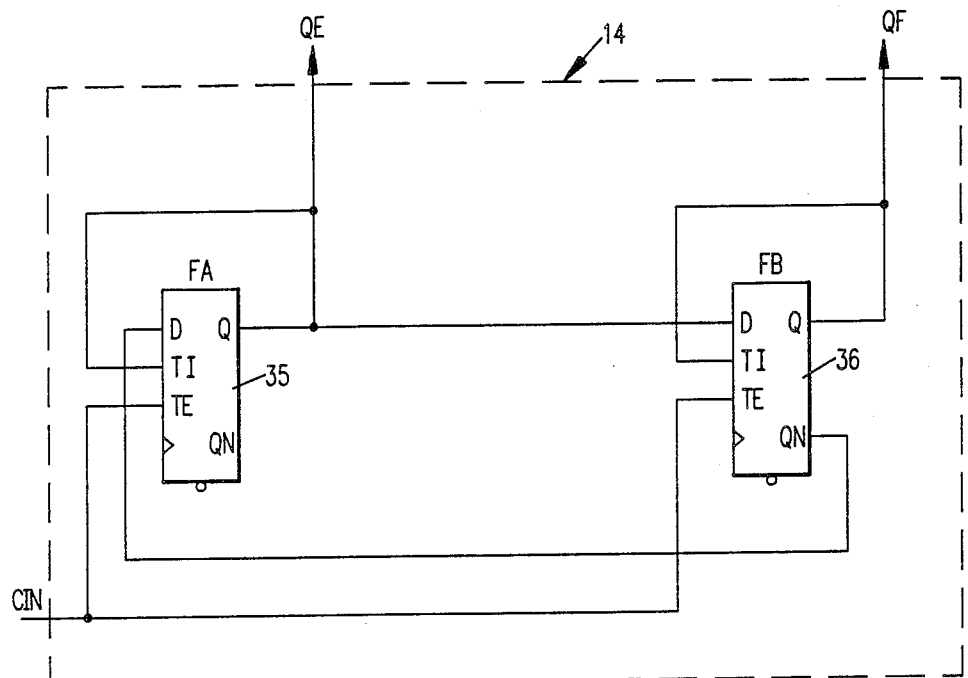
FIG. 3 is a schematic diagram of a logic circuit employed in FIG. 1 for generating the most significant boundary block of two bits.

With reference to FIG. 3, a logic circuit 14 is illustrated wherein D flip-flops 34 and 36 are operated in response to a carry input (CIN) signal. The flip-flops 34 and 36 are coupled to produce QE and QF outputs (or their complements QEN or QFN), which respectively correspond to the E and F outputs of logic circuit 14 shown in FIG. 1. A state table for the operation of the logic circuit of FIG. 3 is set forth as follows:

| Time Unit | CIN | QE | QEN | QF | QFN |
|---|---|---|---|---|---|
| 0 | 1 | 0 | 1 | 0 | 1 |
| 1 | 1 | 0 | 1 | 0 | 1 |
| 2 | 0 | 0 | 1 | 1 | 0 |
| 3 | 0 | 1 | 0 | 1 | 0 |
| 4 | 0 | 1 | 0 | 0 | 0 |

-continued

| Time Unit | CIN | QE | QEN | QF | QFN |
|---|---|---|---|---|---|
| 5 | 0 | 0 | 1 | 0 | 1 |

If CIN=1, the state remains unchanged. If CIN=0, the state is changed by incrementing one digit or bit. A reset occurs at the fourth occurrence of CIN=0.

Figure 4:
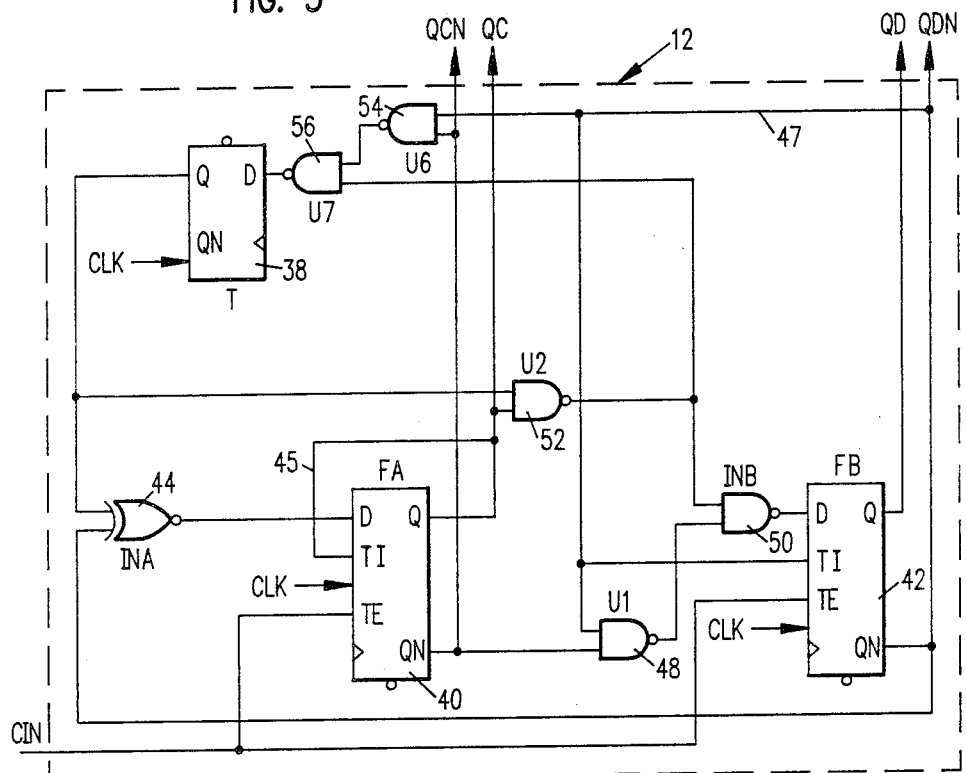
FIG. 4 is a schematic diagram of a logic circuit employed in FIG. 1 for generating boundary blocks that are intermediate to the least significant and most significant boundary blocks illustrated in FIGS. 2 and 3 respectively.

With reference to FIG. 4, logic circuit 12 includes D flip-flops 38, 40 and 42. An exclusive NOR gate 44 is tied to the D input of the flip flop 40, which receives a clock signal and a carry input CIN signal. When the CIN signal is a binary zero, the flip flop 40 is enabled and is incremented or decremented. Flip flop 40 provides a QC output or a QCN output. The QCN output signal is applied through NAND gates 48 and 50 to the D input of flip flop 42. Flip flop 42 also receives clock and carry input signals. The flip flops 40 and 42 are characterized by feedback loops 45 and 47 that serve to increment the flip flop stages when enabled by a binary zero CIN signal. The logic circuit 12 also includes NAND gate 52 coupled to the Q output of flip flop 40 and the Q output of flip flop 38, and having its output connected to NAND gate 50. NAND gates 54 and 56 are coupled to the D input of flip flop 38 and to the QN outputs of flip flops 40 and 42 to control the state of flip flop 38.

In operation, a carry input signal CIN is applied in conjunction with a clock signal CLK to the flip-flops 40 and 42. Whenever a carry input signal having a binary value of 1 is applied, the present state is held at the same value and the two-bit module of QC and QD (or their complements QCN and QDN) is unchanged. Whenever a carry input signal having a binary value of 0 is applied, then the present state is incremented or decremented to the next state in the counting sequence. After each eight consecutive expressions of two-bit modules, when the carry input signal is zero, the logic circuit 12 is reset and the state of the module changes to 0-0.

The following state table indicates the sequence of changes in binary states at each clock input for the two-bit modules having the QC and QD states (or their complements QCN and QDN states), corresponding to the C and D outputs of logic circuit 12 as shown in FIG. 1.

| Time Unit | CIN | QD | QDN | QC | QCN | I | INC | u1 | u2 | IND | u6 | u7 |
|---|---|---|---|---|---|---|---|---|---|---|---|---|
| 0 | 1 | 0 | 1 | 0 | 1 | 1 | 1 | 1 | 1 | 0 | 0 | 1 |
| 1 | 1 | 0 | 1 | 0 | 1 | 1 | 1 | 1 | 1 | 0 | 0 | 1 |
| 2 | 0 | 0 | 1 | 1 | 0 | 1 | 1 | 1 | 0 | 1 | 1 | 1 |
| 3 | 0 | 1 | 0 | 1 | 0 | 1 | 0 | 1 | 0 | 1 | 1 | 1 |
| 4 | 1 | 1 | 0 | 1 | 0 | 1 | 0 | 1 | 0 | 1 | 1 | 1 |

-continued

| Time Unit | CIN | QD | QDN | QC | QCN | I | INC | u1 | u2 | IND | u6 | u7 |
|---|---|---|---|---|---|---|---|---|---|---|---|---|
| 5 | 1 | 1 | 0 | 1 | 0 | 1 | 0 | 1 | 0 | 1 | 1 | 1 |
| 6 | 0 | 1 | 0 | 0 | 1 | 1 | 0 | 0 | 1 | 1 | 1 | 0 |
| 7 | 0 | 1 | 0 | 0 | 1 | 0 | 1 | 0 | 1 | 1 | 1 | 0 |
| 8 | 0 | 1 | 0 | 1 | 0 | 0 | 1 | 1 | 1 | 0 | 1 | 0 |
| 9 | 0 | 0 | 1 | 1 | 0 | 0 | 0 | 1 | 1 | 0 | 1 | 0 |
| 10 | 0 | 0 | 1 | 0 | 1 | 0 | 0 | 1 | 1 | 0 | 0 | 1 |
| 11 | 0 | 0 | 1 | 0 | 1 | 1 | 1 | 1 | 1 | 0 | 0 | 1 |
| . | . | . | . | . | . | . | . | . | . | . | . | . |

Figure 5:
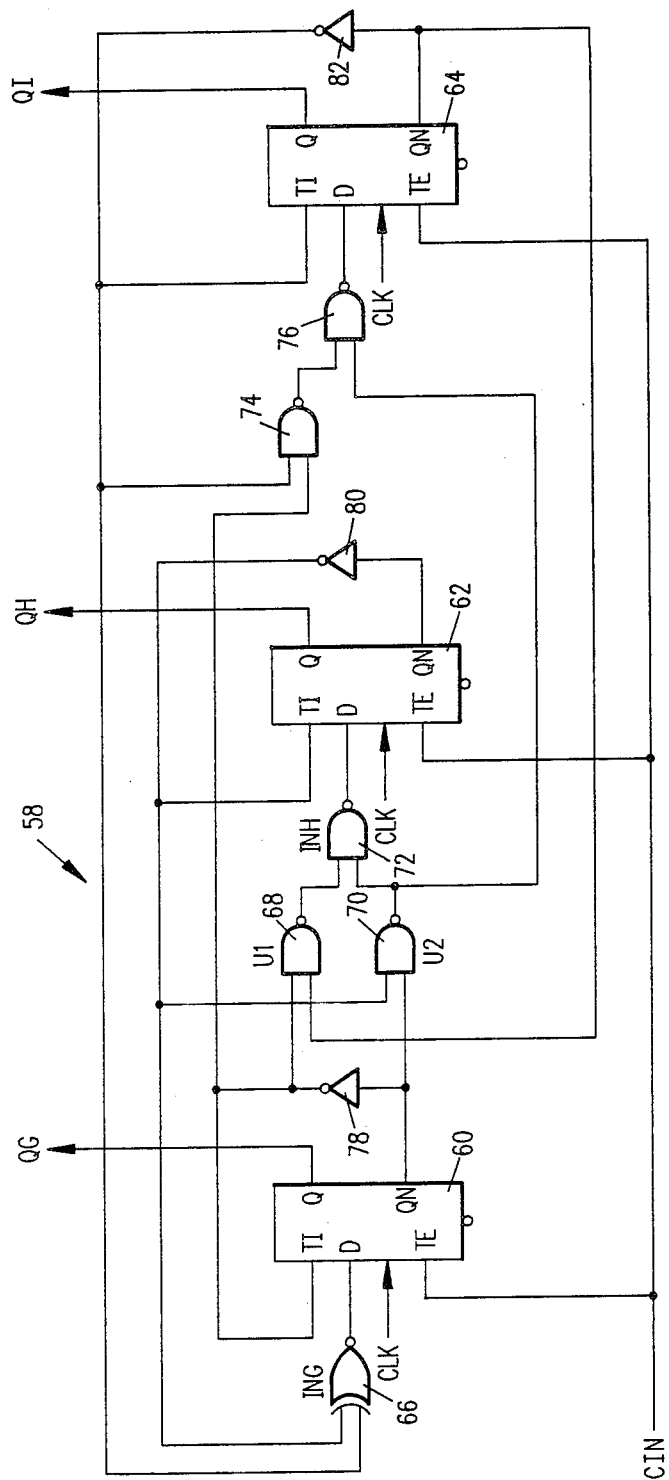
FIG. 5 is a logic circuit diagram illustrating the generation of a three bit boundary block or module to be used with numbers or expressions having an odd number of bits, as implemented in a Gray code counter.

When expressions having an odd number of bits are formed for each state, one counter which stores and processes a module of three bits is used. For example, if an expression of 7 bits is to be implemented, the logic circuit network includes logic circuit 10 with a two-bit module, logic circuit 12 with a two-bit module, and a logic circuit 58 with a three-bit module which is shown in FIG. 5. The logic circuit 58 provides an output of three bits, QG, QH and QI. The progression or count sequence of three-bit modules generated by logic circuit 58 is as follows:

| Time Unit | CIN | QI | QIN | QH | QHN | QG | QGN | ING | u1 | u2 | INH | u3 | u4 |
|---|---|---|---|---|---|---|---|---|---|---|---|---|---|
| 0 | 0 | 0 | 0 | 0 | 1 | 0 | 1 | 1 | 1 | 1 | 0 | 1 | 0 |
| 1 | 0 | 0 | 1 | 0 | 1 | 1 | 0 | 1 | 0 | 1 | 1 | 1 | 0 |
| 2 | 0 | 0 | 1 | 1 | 0 | 1 | 0 | 0 | 0 | 1 | 1 | 1 | 0 |
| 3 | 0 | 0 | 1 | 1 | 0 | 0 | 1 | 0 | 1 | 0 | 1 | 1 | 1 |
| 4 | 0 | 1 | 0 | 1 | 0 | 0 | 1 | 1 | 1 | 0 | 1 | 1 | 1 |
| 5 | 0 | 1 | 0 | 1 | 0 | 1 | 0 | 1 | 1 | 1 | 0 | 0 | 1 |
| 6 | 0 | 1 | 0 | 0 | 1 | 1 | 0 | 0 | 1 | 1 | 0 | 0 | 1 |
| 7 | 0 | 1 | 0 | 0 | 1 | 0 | 1 | 0 | 1 | 1 | 0 | 1 | 0 |
| 8 | 0 | 0 | 1 | 0 | 1 | 0 | 1 | 1 | 1 | 1 | 0 | 1 | 0 |
| 9 | 1 | 0 | 1 | 0 | 1 | 0 | 1 | 1 | 1 | 1 | 0 | 1 | 0 |
| . | | | | | | | | | | | | | |

To obtain this count sequence, the logic circuit 58 includes D flip flops 60, 62 and 64, each of which receives a clock signal CLK and an enabling carry input signal CIN.

The flip flops 60, 62 and 64 respectively provide the QG, QH and QI binary bit outputs to form a three-bit module. The logic circuit 58 includes an exclusive NOR gate 66 that provides an incrementing signal ING at the input of flip flop 60; NAND gates 68 and 70 that are coupled to a NAND gate 72, which provides an incrementing signal INH to flip flop 62; and NAND gate 76 which receives the output of NAND gates 70 and 74 and is coupled to the D input of flip flop 64. Inverters 78, 80 and 82 are connected respectively to the QN output states of flip flops 60, 62 and 64.

In operation, when CIN is 1, the existing state remains unchanged for the next time interval. However, when CIN is 0, then the expression of the existing state is incremented so that one binary bit or digit of the next state is changed at only one location.

In those cases where expressions of more than 8 bits are to be used, the logic network includes one logic circuit 10 with the least significant bit, one logic circuit 14 with the most significant bit, and a plurality of intermediate logic circuits 12. If an expression is to be formed with an odd number of bits, then a logic circuit 58, as illustrated in FIG. 5 is included.

Figure 6:
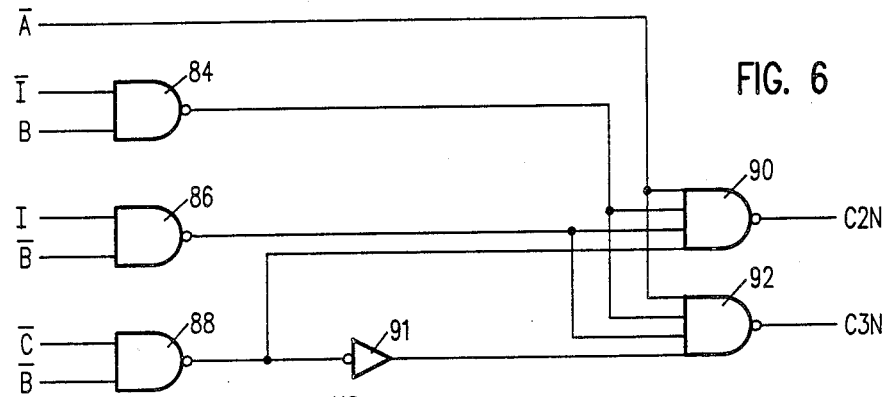
FIG. 6 is a logic circuit diagram showing carry logic for a six bit Gray code counter.

FIG. 6 depicts a carry logic circuit 16 for providing the carry signals C2N and C3N to the logic circuits 12 and 14, respectively, as illustrated in FIG. 1. Three NAND gates 84, 86 and 88 are coupled to the four input lines of each of NAND gates 90 and 92 which provide respectively the carry output signals C2N and C3N. The carry signals are derived from a logical OR of the input signals provided to the NAND gates, as expressed by the following logic equations:

$$C2N = I\bar{B} + A + \bar{C}\bar{B} \quad (1)$$

$$C3N = I\bar{B} + \bar{I}B + A + \overline{\bar{C}\bar{B}} \quad (2)$$

The carry logic circuit includes an inverter 91 which is connected between NAND gate 88 and an input of NAND gate 92.

Figure 7:
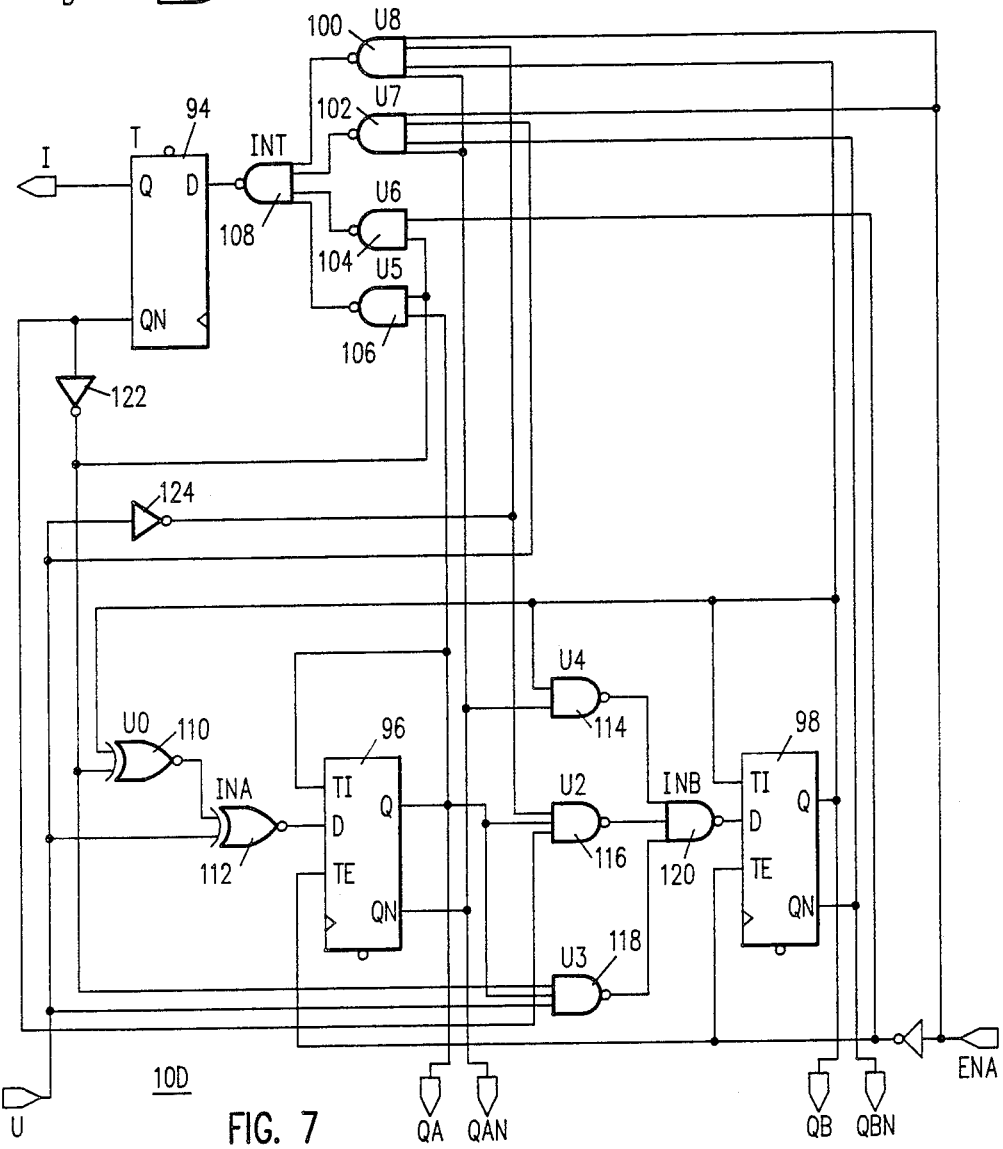
FIGS. 7-9 are logic circuit diagrams illustrating the implementation of increment and decrement functions of a Gray code counter that operates with two bit modules, in accordance with this invention.

In order to provide both incrementing and decrementing functions, alternative embodiments of the logic circuits 10, 12 and 14 are provided. FIG. 7 illustrates a logic circuit 10D, which is an alternative to logic circuit 10 of FIG. 1. Logic circuit 10D has both incrementing and decrementing logic capability and can operate with Gray code counters that process expressions having up to 32 bits. The logic equations applicable to the logic circuit 10D are as follows:

$$INB = B\bar{A} + u\bar{I}A + \bar{u}\bar{I}A \quad (3)$$

$$INT = \overline{ENAI} + IA + ENA\bar{u}B\bar{A} + ENAu\bar{B}\bar{A} \quad (4)$$

$$INA = u \odot (I \oplus B) \quad (5)$$

where u represents an increment or decrement signal, i.e. binary 1 or a 0 for counting up or down, as supplied by a controller or microprocessor that has been programmed by the user. Similarly, the ENA signal is supplied by a controller or microprocessor as a binary 1 to enable the circuit to count up or down, whereas a binary 0 will not change the existing expression. The ⊙ represents an exclusive NOR function, and the ⊕ represents an exclusive OR function.

Equation 5 can also be written as $$INA = U\bar{IB} + U\bar{I}B + \overline{UIB} + \overline{U}IB \qquad (5')$$

which can be implemented as pure NAND gates. The equation where written as $INA = u \odot (I \oplus B)$ uses an exclusive OR gate and exclusive NOR gate. In this latter representation, the implementation is more compact and dense.

In FIG. 7, logic circuit 10D is shown. The circuit includes D flip-flops 94, 96 and 98 with NAND gates 100, 102, 104 and 106 coupled to the outputs of the flip-flops 96 and 98 and the D input of flip-flop 94 through the NAND gate 108. NAND gates 114, 116 and 118 are coupled to the D input of flip-flop 98 through a NAND gate 120. Flip-flop 96 receives signals from an exclusive NOR gate 112 which receives one input through exclusive OR gate 110 and a second input of an instruction signal u for counting up or down.

The functional table that is applicable to the logic circuit 10D for counting up or down is as follows:

| Time Unit | ENA | u | QB | QBN | QA | QAN | I | u0 | INA | u2 | u3 | u4 | INB | u5 | u6 | u7 | u8 | ENT |
|---|---|---|---|---|---|---|---|---|---|---|---|---|---|---|---|---|---|---|
| 0 | 1 | 1 | 0 | 1 | 0 | 1 | 1 | 1 | 1 | 1 | 1 | 1 | 0 | 1 | 1 | 0 | 1 | 1 |
| 1 | 1 | 1 | 0 | 1 | 1 | 0 | 1 | 1 | 1 | 1 | 0 | 1 | 1 | 0 | 1 | 1 | 1 | 1 |
| 2 | 1 | 1 | 1 | 0 | 1 | 0 | 1 | 1 | 0 | 1 | 0 | 1 | 1 | 0 | 1 | 1 | 1 | 1 |
| 3 | 1 | 1 | 1 | 0 | 0 | 1 | 1 | 1 | 0 | 1 | 1 | 0 | 1 | 1 | 1 | 1 | 1 | 0 |
| 4 | 1 | 1 | 1 | 0 | 0 | 1 | 0 | 0 | 1 | 1 | 1 | 0 | 1 | 1 | 1 | 1 | 1 | 0 |
| 5 | 1 | 1 | 1 | 0 | 1 | 0 | 0 | 0 | 1 | 1 | 1 | 1 | 0 | 1 | 1 | 1 | 1 | 0 |
| 6 | 1 | 1 | 0 | 1 | 1 | 0 | 0 | 0 | 0 | 1 | 1 | 1 | 0 | 1 | 1 | 1 | 1 | 0 |
| 7 | 1 | 0 | 1 | 0 | 1 | 0 | 0 | 0 | 0 | 0 | 1 | 1 | 1 | 1 | 1 | 1 | 1 | 0 |
| 8 | 1 | 0 | 1 | 0 | 0 | 1 | 0 | 0 | 0 | 1 | 1 | 0 | 1 | 1 | 1 | 1 | 0 | 1 |
| 9 | 0 | 0 | 1 | 0 | 0 | 1 | 0 | 0 | 0 | 1 | 1 | 0 | 1 | 1 | 1 | 1 | 1 | 0 |

Figure 8:
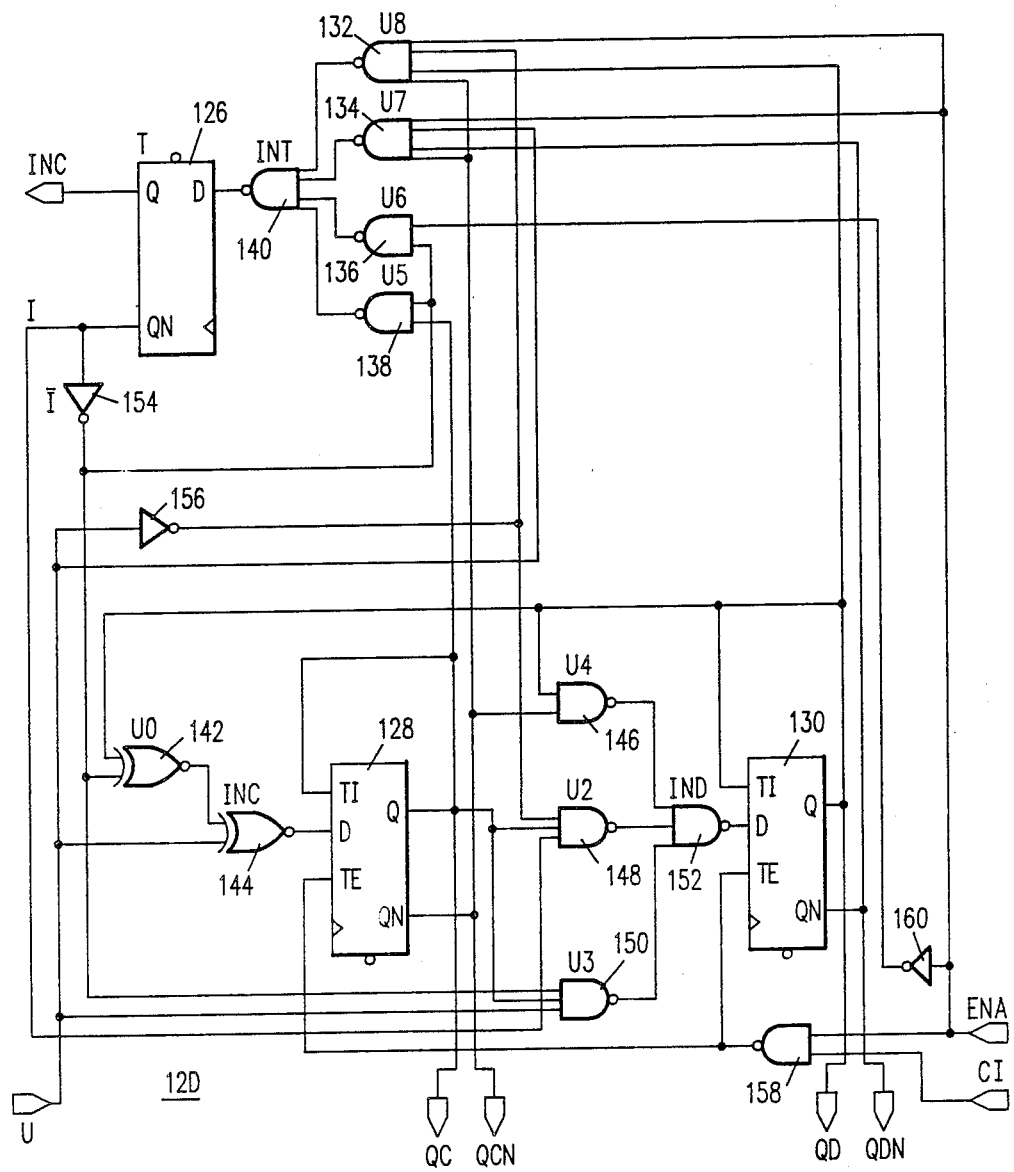

In FIG. 8, an increment-decrement logic circuit 12D is shown. The increment-decrement logic circuit includes D flip-flops 126, 128 and 130 with NAND gates 132, 134, 136 and 138 coupled to the outputs of the flip-flops 128 and 130 and the D input of flip-flop 126 through the NAND gate 140. NAND gates 146, 148 and 150 are coupled to the D input of flip-flop 130 through a NAND gate 152. Flip-flop 128 receives signals from an exclusive NOR gate 144 which receives one input through an exclusive OR gate 142 and a second input of an instruction signal u for counting up or down. The u increment or decrement signal is received from a controller or microprocessor that has been programmed by a user, for example. The logic circuit also includes inverters 154 and 156 for inverting the u signal and the QN output of flip-flop 126. With the flip-flops set by the count signal u, an enable signal ENA and a carry in signal CI are provided through a NAND gate 158, which triggers flip-flop 128 to change its state and initiate a count up or count down function. The enable signal ENA is also directed through an inverter 160 to the NAND gate 136 which receives the inverted signal from inverter 154 to provide one input to the NAND gate 140. The logic equations that are applicable to the logic circuit of FIG. 8 are as follows:

$$IND = D\bar{C} = uIC = uIC \qquad (6)$$

$$INT = \overline{ENA}I + IC + EN\bar{A}u\bar{D}\bar{C} + ENAu\bar{D}\bar{C} \qquad (7)$$

$$INC = u \odot (I \oplus D) \qquad (8)$$

The state table for the circuit 12D of FIG. 8 is as follows:

| Time Unit | ENA | u | CI | QD | QDN | QC | QCN | I | u0 | INC | u2 | u3 | u4 | IND | u5 | u6 | u7 | u8 | INT |
|---|---|---|---|---|---|---|---|---|---|---|---|---|---|---|---|---|---|---|---|
| 0 | 1 | 1 | 1 | 0 | 1 | 0 | 1 | 1 | 1 | 1 | 1 | 1 | 1 | 0 | 1 | 1 | 0 | 1 | 1 |
| 1 | 1 | 1 | 1 | 0 | 1 | 1 | 0 | 1 | 1 | 1 | 1 | 0 | 1 | 1 | 0 | 1 | 1 | 1 | 1 |
| 2 | 1 | 1 | 1 | 1 | 0 | 1 | 0 | 1 | 0 | 0 | 1 | 0 | 1 | 1 | 0 | 1 | 1 | 1 | 1 |
| 3 | 1 | 1 | 1 | 1 | 0 | 0 | 1 | 1 | 0 | 0 | 1 | 1 | 0 | 1 | 1 | 1 | 1 | 1 | 0 |
| 4 | 1 | 1 | 1 | 1 | 0 | 0 | 1 | 0 | 1 | 1 | 1 | 1 | 0 | 1 | 1 | 1 | 1 | 1 | 0 |
| 5 | 1 | 1 | 0 | 1 | 0 | 0 | 1 | 0 | 1 | 1 | 1 | 1 | 0 | 1 | 1 | 1 | 1 | 1 | 0 |
| 6 | 1 | 1 | 1 | 1 | 0 | 1 | 0 | 0 | 1 | 1 | 1 | 1 | 1 | 0 | 1 | 1 | 1 | 1 | 0 | where ENA=1 is an enable function and ENA=0 is a disable function; u=1 is an up instruction, and u=0 is a down instruction; and CI=1 when carry-in is active, and CI=0 when carry-in is inactive.

Figure 9:
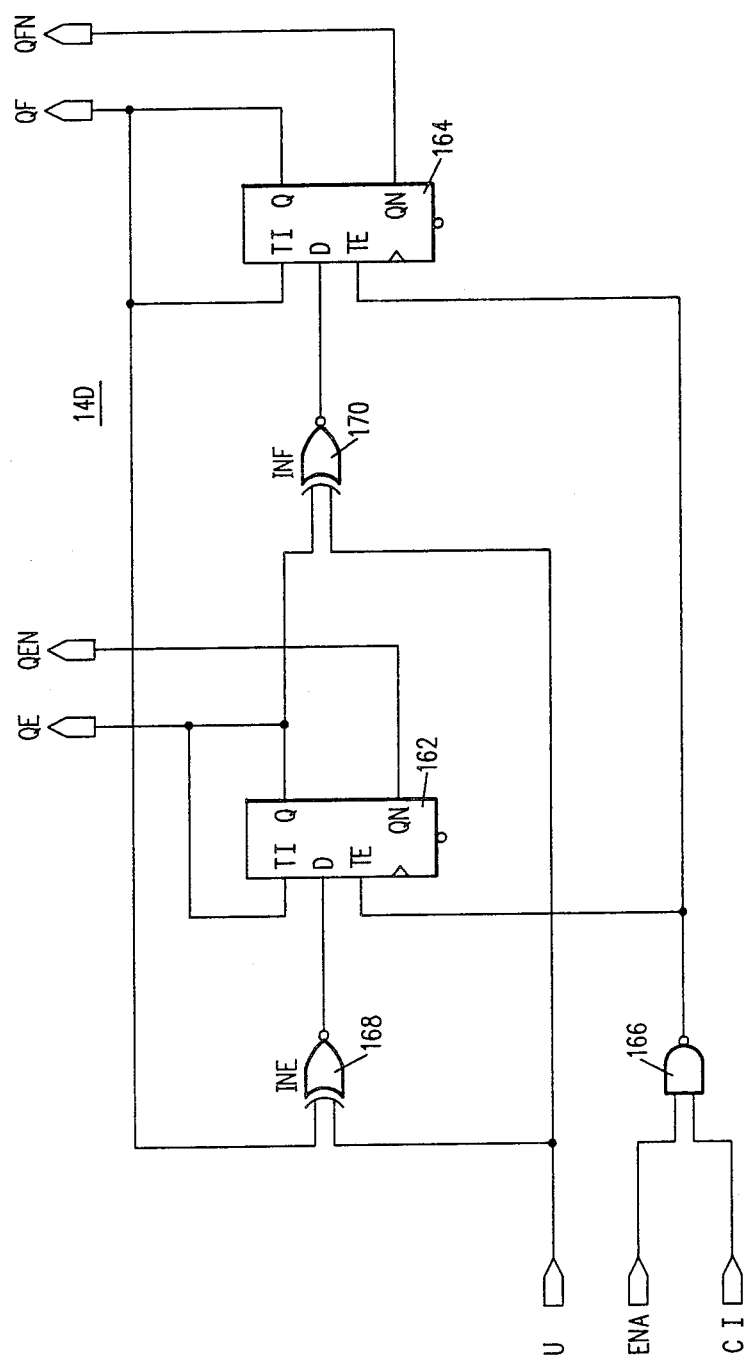

With reference to FIG. 9, a logic circuit 14D provides increment/decrement functions to the logic circuit 14 shown in FIG. 3. The circuit includes D flip-flops 162 and 164 coupled to a NAND gate 166 which receives enable ENA and carry-in CI signals. A count up or count down signal u is provided through an exclusive OR gate 168 to the D input flip-flop 162, and through an exclusive NOR gate 170 to the D input flip-flop 164. The logic equations that are utilized for obtaining the QE, QEN, QF and QFN outputs are as follows:

$$INE = u \oplus F \qquad (9)$$

$$INF = u \odot E \qquad (10)$$

Figure 10:
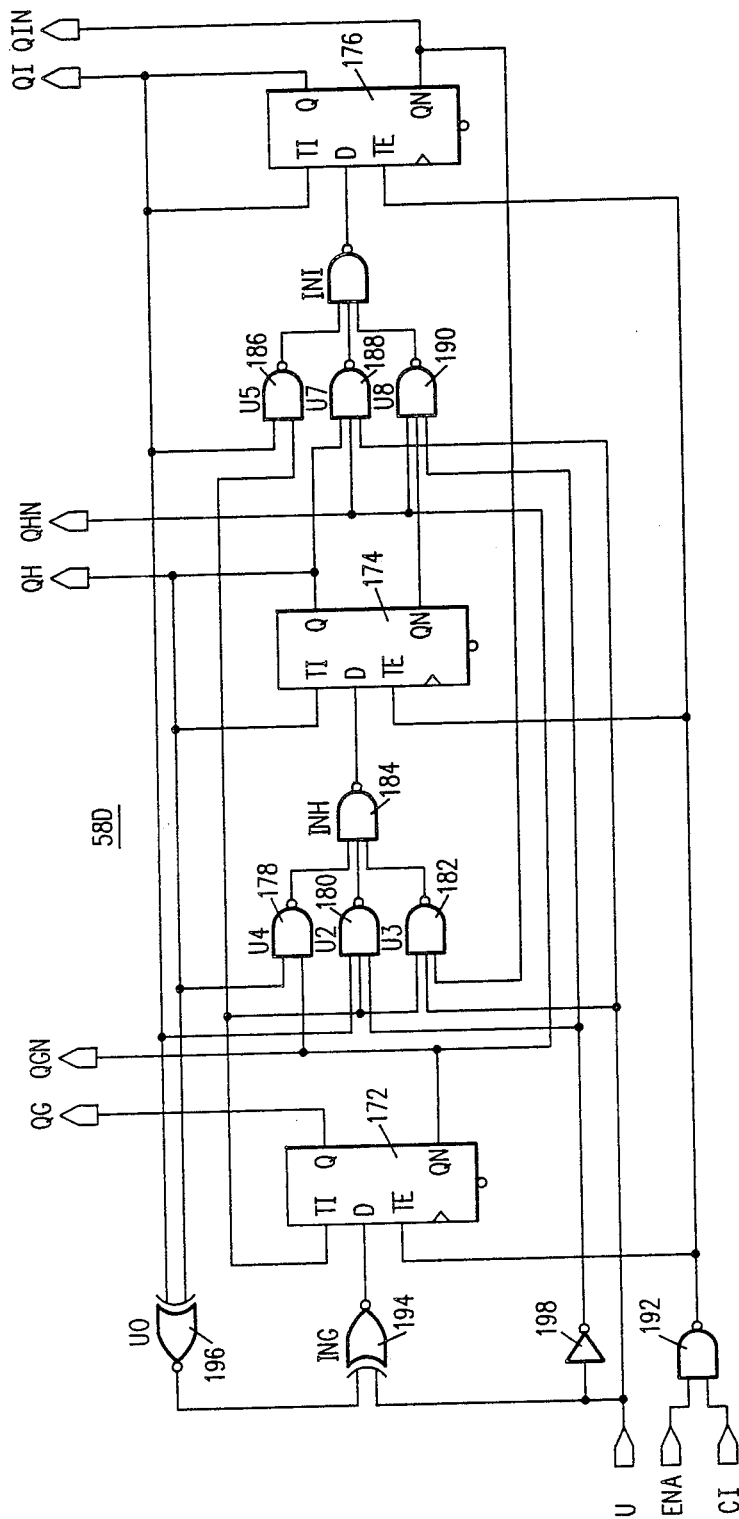
FIG. 10 is a logic circuit diagram illustrating the implementation of increment and decrement functions of a Gray code counter operating with a three bit module.

FIG. 10 depicts a logic circuit 58D for providing a module of three bits, QG, QH, QI or their complements QGN, QHN, or QIN. In the logic circuit of FIG. 10, flip-flops 172, 174 and 176 are coupled to provide output signals QG, QH, QI and their complements QGN, QHN, QIN. A NAND gate 178 is coupled to receive the QN signal from flip-flop 172 and the Q output signal of flip-flop 174. Two NAND gates 180 and 182 each having three inputs provide an output in conjunction with NAND gate 178 to NAND gate 184 which provides an input to the D terminal of flip-flop 174. Similarly, NAND gates 186, 188 and 190 are coupled to the D input of the flip-flop 176. An exclusive NOR gate 194 is provided at the input to the flip-flop 172 and receives the count signal u. An inverter 198 is provided between the u input and the NAND gates 180 and 190.

The equations that represent the logic functions of the circuit 58D of FIG. 10 are as follows:

$$ING = u \odot (H \odot I) \tag{11}$$

$$INH = \overline{HG} + u\overline{IG} + \overline{u}IG \tag{12}$$

$$INI = IG + u\overline{HG} + \overline{u}\overline{HG} \tag{13}$$

The state table that is applicable to the logic circuit 58D is as follows:

| Time Units | ENA | U | CI | QI | QH | QG | u0 | ING | u2 | u3 | u4 | INH | u5 | u7 | u8 | INT |
|---|---|---|---|---|---|---|---|---|---|---|---|---|---|---|---|---|
| 0 | 1 | 1 | 1 | 0 | 0 | 0 | 1 | 1 | 1 | 1 | 1 | 0 | 1 | 1 | 1 | 0 |
| 1 | 1 | 1 | 1 | 0 | 0 | 1 | 1 | 1 | 1 | 0 | 1 | 1 | 1 | 1 | 1 | 0 |
| 2 | 1 | 1 | 1 | 0 | 1 | 1 | 0 | 0 | 1 | 0 | 1 | 1 | 1 | 1 | 1 | 0 |
| 3 | 1 | 1 | 1 | 0 | 1 | 0 | 0 | 0 | 1 | 1 | 0 | 1 | 1 | 0 | 1 | 1 |
| 4 | 1 | 1 | 1 | 1 | 1 | 0 | 1 | 1 | 1 | 1 | 0 | 1 | 1 | 0 | 1 | 1 |
| 5 | 1 | 1 | 1 | 1 | 1 | 1 | 1 | 1 | 1 | 1 | 1 | 0 | 0 | 1 | 1 | 1 |
| 6 | 1 | 0 | 1 | 1 | 1 | 0 | 1 | 0 | 1 | 1 | 0 | 1 | 1 | 1 | 1 | 0 |
| 7 | 1 | 0 | 1 | 0 | 1 | 0 | 0 | 1 | 1 | 1 | 0 | 1 | 1 | 1 | 1 | 0 |
| 8 | 1 | 0 | 1 | 0 | 1 | 1 | 0 | 1 | 1 | 1 | 1 | 0 | 1 | 1 | 1 | 0 |

The input signals that are applied to this circuit include the enable ENA, the count signal u, and carry input CI. The u2–u8 references at the NAND gates represent the state of the logic gates for any given time interval.

In accordance with one embodiment of this invention, Gray code counters can be implemented that process expressions of four bits through 32 bits. In order to implement a Gray code counter that processes from four bits up to 32 bits in an expression, carry logic equations are used for providing carry input signals C2N through C16N. It should be understood that the invention is not limited necessarily to the processing of any expressions of four bits through 32 bits, but is applicable to any number of n bits for which logic equations can be formulated for a Gray code counter. The logic equations for implementing the carry logic functions are as follows:

4–5 Bit
C2N = $\overline{IB} + \overline{I}B + A$

6–7 Bit
C2N = $\overline{IB} + \overline{I}B + A + \overline{CB}$
C3N = $\overline{IB} + \overline{I}B + A + \overline{C}B$ 8–9 Bit
C2N = $\overline{IB} + \overline{I}B + A + \overline{CB}$
C3N = $\overline{IB} + \overline{I}B + A + \overline{CB} + \overline{ED}$
C4N = $\overline{IB} + \overline{I}B + A + \overline{C}B + \overline{E}D$ 10–11 Bit
C2N = $\overline{IB} + \overline{I}B + A + \overline{CB}$
C3N = $\overline{IB} + \overline{I}B + A + \overline{CB} + \overline{ED}$
C4N = $\overline{IB} + \overline{I}B + A + \overline{CB} + \overline{ED} + \overline{GF}$
C5N = $\overline{IB} + \overline{I}B + A + \overline{C}B + \overline{E}D + \overline{G}F$ 12–13 Bit
C2N = $\overline{IB} + \overline{I}B + A + \overline{CB}$
C3N = $\overline{IB} + \overline{I}B + A + \overline{CB} + \overline{ED}$
C4N = $\overline{IB} + \overline{I}B + A + \overline{CB} + \overline{ED} + \overline{GF}$
C5N = $\overline{IB} + \overline{I}B + A + \overline{CB} + \overline{ED} + \overline{GF} + \overline{IH}$
C6N = $\overline{IB} + \overline{I}B + A + \overline{C}B + \overline{E}D + \overline{G}F + \overline{I}H$ 14–15 Bit
C2N = $\overline{IB} + \overline{I}B + A + \overline{CB}$
C3N = $\overline{IB} + \overline{I}B + A + \overline{CB} + \overline{ED}$
C4N = $\overline{IB} + \overline{I}B + A + \overline{CB} + \overline{ED} + \overline{GF}$
C5N = $\overline{IB} + \overline{I}B + A + \overline{CB} + \overline{ED} + \overline{GF} + \overline{IH}$
C6N = $\overline{IB} + \overline{I}B + A + \overline{CB} + \overline{ED} + \overline{GF} + \overline{IH} + \overline{KJ}$
C7N = $\overline{IB} + \overline{I}B + A + \overline{C}B + \overline{E}D + \overline{G}F + \overline{I}H + \overline{K}J$ 16–17 Bit
C2N = $\overline{IB} + \overline{I}B + A + \overline{CB}$
C3N = $\overline{IB} + \overline{I}B + A + \overline{CB} + \overline{ED}$
C4N = $\overline{IB} + \overline{I}B + A + \overline{CB} + \overline{ED} + \overline{GF}$
C5N = $\overline{IB} + \overline{I}B + A + \overline{CB} + \overline{ED} + \overline{GF} + \overline{IH}$
C6N = $\overline{IB} + \overline{I}B + A + \overline{CB} + \overline{ED} + \overline{GF} + \overline{IH} + \overline{KJ}$
C7N = $\overline{IB} + \overline{I}B + A + \overline{CB} + \overline{ED} + \overline{GF} + \overline{IH} + \overline{KJ} + \overline{ML}$
C8N = $\overline{IB} + \overline{I}B + A + \overline{C}B + \overline{E}D + \overline{G}F + \overline{I}H + \overline{K}J + \overline{M}L$ -continued 18-19 Bit
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}$ 20-21 Bit
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}+\overline{QP}$
C10N = $\overline{IB}+\overline{I}B+A+\overline{CB}+\overline{ED}+\overline{GF}+\overline{IH}+\overline{KJ}+\overline{ML}+\overline{ON}+\overline{QP}$ 22-23 Bits
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}+\overline{QP}$
C10N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}$
C11N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}$ 24-25 Bits
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}+\overline{QP}$
C10N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}$
C11N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$
C12N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$ 26-27 Bits
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}+\overline{QP}$
C10N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}$
C11N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$
C12N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}$
C13N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}$ 28-29 Bits
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}+\overline{QP}$
C10N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}$
C11N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$
C12N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}$
C13N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}$
C14N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}$ 30-31 Bits
C2N = $\overline{IB}+\overline{I}B+A+\overline{CB}$
C3N = $\overline{IB}+\overline{I}B+A+\overline{CB}+\overline{ED}$
C4N = $\overline{IB}+\overline{I}B+A+\overline{CB}+\overline{ED}+\overline{GF}$
C5N = $\overline{IB}+\overline{I}B+A+\overline{CB}+\overline{ED}+\overline{GF}+\overline{IH}$
C6N = $\overline{IB}+\overline{I}B+A+\overline{CB}+\overline{ED}+\overline{GF}+\overline{IH}+\overline{KJ}$
C7N = $\overline{IB}+\overline{I}B+A+\overline{CB}+\overline{ED}+\overline{GF}+\overline{IH}+\overline{KJ}+\overline{ML}$
C8N = $\overline{IB}+\overline{I}B+A+\overline{CB}+\overline{ED}+\overline{GF}+\overline{IH}+\overline{KJ}+\overline{ML}+\overline{ON}$
C9N = $\overline{IB}+\overline{I}B+A+\overline{CB}+\overline{ED}+\overline{GF}+\overline{IH}+\overline{KJ}+\overline{ML}+\overline{ON}+\overline{QP}$
C10N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}$
C11N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$
C12N = $\overline{IB}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}$ -continued

```
C13N = IB̄+ĪB+A+C̄B̄+ĒD̄+ḠF̄+ĪH̄+K̄J̄+M̄L̄+ŌN̄+ŌP̄+S̄R̄+ŪT̄+W̄V̄+ȲX̄
C14N = IB̄+ĪB+A+C̄B̄+ĒD̄+ḠF̄+ĪH̄+K̄J̄+M̄L̄+ŌN̄+ŌP̄+S̄R̄+ŪT̄+W̄V̄+ȲX̄+Q̄₂₇Z
C15N = IB̄+ĪB+A+C̄B̄+ĒD+ḠF+ĪH+K̄J+M̄L+ŌN+ŌP+S̄R+ŪT+W̄V+ȲX+Q̄₂₇Z
```

32 Bits

```
C2N = IB̄+ĪB+A+C̄B̄
C3N = IB̄+ĪB+A+C̄B̄+ĒD̄
C4N = IB̄+ĪB+A+C̄B̄+ĒD̄+ḠF̄
C5N = IB̄+ĪB+A+C̄B̄+ĒD̄+ḠF̄+ĪH̄
C6N = IB̄+ĪB+A+C̄B̄+ĒD̄+ḠF̄+ĪH̄+K̄J̄
C7N = IB̄+ĪB+A+C̄B̄+ĒD̄+ḠF̄+ĪH̄+K̄J̄+M̄L̄
C8N = IB̄+ĪB+A+C̄B̄+ĒD̄+ḠF̄+ĪH̄+K̄J̄+M̄L̄+ŌN̄
C9N = IB̄+ĪB+A+C̄B̄+ĒD̄+ḠF̄+ĪH̄+K̄J̄+M̄L̄+ŌN̄+ŌP̄
C10N = IB̄+ĪB+A+C̄B̄+ĒD̄+ḠF̄+ĪH̄+K̄J̄+M̄L̄+ŌN̄+ŌP̄+S̄R̄
C11N = IB̄+ĪB+A+C̄B̄+ĒD̄+ḠF̄+ĪH̄+K̄J̄+M̄L̄+ŌN̄+ŌP̄+S̄R̄+ŪT̄
C12N = IB̄+ĪB+A+C̄B̄+ĒD̄+ḠF̄+ĪH̄+K̄J̄+M̄L̄+ŌN̄+ŌP̄+S̄R̄+ŪT̄+W̄V̄
C13N = IB̄+ĪB+A+C̄B̄+ĒD̄+ḠF̄+ĪH̄+K̄J̄+M̄L̄+ŌN̄+ŌP̄+S̄R̄+ŪT̄+W̄V̄+ȲX̄
C14N = IB̄+ĪB+A+C̄B̄+ĒD̄+ḠF̄+ĪH̄+K̄J̄+M̄L̄+ŌN̄+ŌP̄+S̄R̄+ŪT̄+W̄V̄+ȲX̄+Q̄₂₇Z
C15N = IB̄+ĪB+A+C̄B̄+ĒD̄+ḠF̄+ĪH̄+K̄J̄+M̄L̄+ŌN̄+ŌP̄+S̄R̄+ŪT̄+W̄V̄+ȲX̄+Q̄₂₇Z+Q̄₂₉Q̄₂₈
C16N = IB̄+ĪB+A+C̄B̄+ĒD+ḠF+ĪH+K̄J+M̄L+ŌN+ŌP+S̄R+ŪT+W̄V+ȲX+Q₂₉Q₂₈+Q̄₂₇Z
``` wherein characters A–Z represent respective output signals from each module and $Q_{27}$, $Q_{28}$ and $Q_{29}$ represent the 27th, 28th and 29th bit respectively of the counter's output.

By virtue of the modular configurations employed to form expressions of binary digits, wherein only one digit in one place of an expression is varied when an expression in one time interval is superseded by the next expression of a progression, a Gray code counter is provided with the capability of processing multiple digit expressions in a simplified and facile manner. The number of logic equations and the corresponding logic circuit components which are used for implementing the logic functions of the Gray code counter circuitry are greatly reduced, in comparison to the very large number of flip-flops and logic gates required in prior art Gray code counters as the number of binary digits for each expression is expanded. Therefore, Gray code counter circuits that are denser, faster, and that use lower power are made possible.

The problem of glitches experienced with prior art decode counters is virtually eliminated by use of a Gray code counter which processess modules or building blocks of binary digits for forming the expressions of a progression of states or numbers. The Gray code counter disclosed herein affords both incrementing and increment/decrement operation, and also can operate as an asynchronous, synchronous Reset or asynchronous Set counter. These features are programmable by the user in any combination. The Gray code counter of this invention reduces propagation delays and improves reliability of performance as a result of the reduction in the number of levels of logic circuitry.

What is claimed is:

1. A Gray code counter wherein binary expressions are processed in a sequence, each expression differing from the preceding expression by one bit in one place only, comprising:
    a first logic circuit for receiving a clock input signal and for providing a first modular output of two binary bits and an increment signal;
    a carry logic circuit coupled to said first logic circuit for receiving said modular output of two binary bits and said increment signal, including means for providing a carry signal;
    at least one logic circuit coupled to said carry logic circuit, said at least one logic circuit having means for receiving a clock input signal, and a carry signal from said carry logic circuit, said carry signal being independent of the state of said at least one logic circuit, said at least one logic circuit providing a second modular output of a plurality of binary bits;
    means for combining said first and second modular outputs to form a sequence of binary bit expressions, each expression representing a state of said counter, wherein only one bit of each succeeding binary bit expression of said sequence is changed in one place of said expression.

2. A Gray code counter as in claim 1, wherein said first logic circuit comprises first, second and third serially connected memory elements, said first memory element including means for providing said increment signal and said second and third memory elements including means for providing a module of two binary bits.

3. A Gray code counter as in claim 1, wherein said carry logic circuit comprises first and second NAND gates, each NAND gate having four input terminals; and third, fourth and fifth NAND gates, each of said third, fourth and fifth NAND gates having two input terminals; means for providing an output signal from said third NAND gate to selected first input terminals of said first and second NAND gates; means for providing an output signal from said fourth NAND gate to selected second input terminals of said first and second NAND gates; means for providing an output signal from said fifth NAND gate to selected third input terminals of said first and second NAND gates; and means for providing a binary bit signal from said first logic circuit to the fourth input terminals of said first and second NAND gates, each of said first and second NAND gates having an output circuit for providing separate independent carry signals.

4. A Gray code counter as in claim 1, wherein said means for combining said modular outputs provides a binary digit expression of at least four bits.

5. A Gray code counter as in claim 1, wherein said second logic circuit comprises means for providing a modular output of three binary bits.

6. A Gray code counter as in claim 1, wherein said first logic circuit comprises means for providing a modular output of binary bits including a least significant bit and said second logic circuit provides a modular output of binary bits including a most significant bit.

7. A Gray code, as in claim 1, wherein said first logic circuit comprises means for providing an increment signal, and a modular output of binary bits, said logic circuit comprising memory elements coupled by logic gates configured to function in accordance with logic equations $$INB = B\bar{A} + uIA + \overline{uI\bar{A}}$$

$$INT = \overline{ENAI} + IA + ENAu\bar{B}\bar{A} + ENAu\bar{B}\bar{A}$$

$$INA = UI\bar{B} + U\bar{I}B + \overline{U\bar{I}B} + \overline{UIB}$$

wherein u represents an increment or decrement signal, A and B are output signals, ENA is an enable signal and INA, INB and INT are the states of the logic elements of the counter.

8. A Gray code counter as in claim 1, wherein said at least one logic circuit comprises a second logic circuit and a third logic circuit coupled between said first and second logic circuits, said second and third logic circuits being coupled to the output of said carry logic circuit, said third logic circuit including means for providing multiples of modular outputs of binary bits, each modular output of said third logic circuit excluding the least significant bit and the most significant bit.

9. A Gray code counter as in claim 8, wherein said third logic circuit comprises means for providing an increment signal, and a modular output of binary bits, said logic circuit comprising memory elements coupled by logic gates configured to function in accordance with logic equations $$IND = D\bar{C} + uIC + \overline{uIC}$$

$$INT = \overline{ENAI} + IC + ENAu\bar{D}\bar{C} + ENAu\overline{DC}$$

$$INC = u \odot (I \oplus D)$$

wherein u represents an increment or decrement signal, C and D are output signals, ENA is an enable signal and INC, IND and INT are the states of the logic elements of the counter.

10. A Gray code counter as in claim 1, comprising means for incrementing modular outputs of two bits for four expressions, and for decrementing said modular outputs for four expressions.

11. A Gray code counter as in claim 8, including means for applying a reset signal to each of said logic circuits to initialize said counter.

12. A Gray code counter as in claim 1, wherein said carry logic circuit comprises logic gate means configured for providing first and second carry signals in accordance with the equations $$C2N = I\bar{B} + \bar{I}B + A + \overline{CB}$$

$$C3N[+] = I\bar{B} + \bar{I}B + A + \overline{CB}$$

wherein I is an incrementing signal, and A, B and C are output signals of said logic circuits.

13. A Gray code counter as in claim 1, wherein said second logic circuit comprises memory means for providing an increment or decrement signal, and a plurality of binary bit output signals, said logic circuit configured to function in accordance with logic equations $$ING = u \odot (H \odot I)$$

$$INH = \bar{H}G + u\bar{I}G + \overline{uIG}$$

$$INI = IG + u\overline{HG} + \overline{uHG}$$

wherein u represents an increment or decrement signal, G, H and I are output signals, ENA is an enable signal and ING, INH and INI are the states of the logic elements of the counter.

14. A Gray code counter as in claim 1, wherein said second logic circuit comprises a first D type flip-flop and a second D type flip-flop, the Q output of said first flip-flop coupled to the D input terminal of said second flip-flop and the QN output of said second flip-flop being coupled to the D input of said first flip-flop.

15. A Gray code counter as in claim 1, wherein said first logic circuit includes means for enabling incrementing or increment/decrement functions for providing modular outputs of two binary bits including the least significant bit.

16. A Gray code counter as in claim 1, wherein said first logic circuit comprises first, second and third D flip-flops, said flip-flops being serially coupled;
first and second NAND gates coupled to one output terminal of said first flip-flop and to the input terminal of said second flip-flop;
third and fourth NAND gates coupled between an output terminal of said first flip-flop and the input circuit of said third flip-flop;
means coupling an output of said third flip-flop to the input of said first flip-flop;
means coupling an output of said second flip-flop to the input of said first flip-flop;
means for providing a first binary bit output signal coupled to the output of said first flip-flop;
means for providing a second binary output signal coupled to the output of said second flip-flop;
means for providing an increment signal coupled to the output of said third flip-flop; and
means for providing a clock signal to each of said flip-flops.

17. A Gray code counter as in claim 1, wherein four or five bit expressions are processed, said carry logic circuit comprising logic gate means configured for providing a carry logic signal in accordance with the logic equation $$C2N = I\bar{B} + \bar{I}B + A$$

where C2N is a carry logic signal, I is an increment signal and A and B are output signals.

18. A Gray code counter as in claim 1, wherein six or seven bit expressions are processed, said carry logic circuit comprising logic means configured for providing carry logic signals in accordance with logic equations $$C2N = I\bar{B} + \bar{I}B + A + \overline{CB}$$

$$C3N = I\bar{B} + \bar{I}B + A + \overline{\overline{CB}}$$

where C2N and C3N are carry logic signals, I is an increment signal and A, B and C are output signals.

19. A Gray code counter as in claim 1 wherein eight or nine bit expressions are processed, said carry logic circuit comprising logic means configured for providing carry logic signals in accordance with the logic equations $$C2N = I\bar{B} + \bar{I}B + A + \overline{CB}$$

$$C3N = I\bar{B} + \bar{I}B + A + \overline{\overline{CB}} + \overline{ED}$$

$$C4N = I\bar{B} + \bar{I}B + A + \overline{\overline{CB}} + \overline{\overline{ED}} + \overline{GF}$$

where C2N, C3N, C4N are carry logic signals, I is an increment signal and A, B, C, D and E are output signals.

20. A Gray code counter as in claim 1 wherein ten or eleven bit expressions are processed, said carry logic circuit comprising logic means configured for providing carry logic signals in accordance with the logic equations $$C2N = I\bar{B}+\bar{I}B+A+\bar{C}B$$

$$C3N = I\bar{B}+\bar{I}B+A+\overline{\bar{C}B}+\bar{E}D$$

$$C4N = I\bar{B}+\bar{I}B+A+\overline{\bar{C}B}+\overline{\bar{E}D}+\bar{G}F$$

$$C5N = I\bar{B}+\bar{I}B+A+\overline{\bar{C}B}+\overline{\bar{E}D}+\overline{\bar{G}F}$$

where C2N, C3N, C4N, C5N are carry logic signals, I is an increment signal and A, B, C, D, E, F and G are output signals.

21. A Gray code counter as in clam 1 wherein twelve or thirteen bit expressions are processed, said carry logic circuit comprising logic means configured for providing carry logic signals in accordance with the logic equations $$C2N = I\bar{B}+\bar{I}B+A+\bar{C}B$$

$$C3N = I\bar{B}+\bar{I}B+A+\overline{\bar{C}B}+\bar{E}D$$

$$C4N = I\bar{B}+\bar{I}B+A+\overline{\bar{C}B}+\overline{\bar{E}D}+\bar{G}F$$

$$C5N = I\bar{B}+\bar{I}B+A+\overline{\bar{C}B}+\overline{\bar{E}D}+\overline{\bar{G}F}+\bar{I}H$$

$$C6N = I\bar{B}+\bar{I}B+A+\overline{\bar{C}B}+\overline{\bar{E}D}+\overline{\bar{G}F}+\overline{\bar{H}I}$$

where C2N, C3N, C4N, C5N, C6N are carry logic signals, I is an increment signal and A, B, C, D, E, F, G, H, and I are output signals.

22. A Gray code counter as in claim 1 wherein fourteen or fifteen bit expressions are processed, said carry logic circuit comprising logic means configured for providing carry logic signals in accordance with the logic equations $$C2N = I\bar{B}+\bar{I}B+A+\bar{C}B$$

$$C3N = I\bar{B}+\bar{I}B+A+\overline{\bar{C}B}+\bar{E}D$$

$$C4N = I\bar{B}+\bar{I}B+A+\overline{\bar{C}B}+\overline{\bar{E}D}+\bar{G}F$$

$$C5N = I\bar{B}+\bar{I}B+A+\overline{\bar{C}B}+\overline{\bar{E}D}+\overline{\bar{G}F}+\bar{I}H$$

$$C6N = I\bar{B}+\bar{I}B+A+\overline{\bar{C}B}+\overline{\bar{E}D}+\overline{\bar{G}F}+\bar{I}J+\bar{K}J$$

$$C7N = I\bar{B}+\bar{I}B+A+\overline{\bar{C}B}+\overline{\bar{E}D}+\overline{\bar{G}F}+\overline{\bar{I}H}+\overline{\bar{K}J}$$

where C2N, C3N, C4N, C5N, C6N, C7N are carry logic signals, I is an increment signal and A, B, C, D, E, F, G, H, I, J and K are output signals.

23. A Gray code counter as in claim 1 wherein sixteen or seventeen bit expressions are processed, said carry logic circuit comprising logic means configured for providing carry logic signals in accordance with the logic equations $$C2N = I\bar{B}+\bar{I}B+A+\bar{C}B$$

$$C3N = I\bar{B}+\bar{I}B+A+\overline{\bar{C}B}+\bar{E}D$$

$$C4N = I\bar{B}+\bar{I}B+A+\overline{\bar{C}B}+\overline{\bar{E}D}+\bar{G}F$$

$$C5N = I\bar{B}+\bar{I}B+A+\overline{\bar{C}B}+\overline{\bar{E}D}+\overline{\bar{G}F}+\bar{I}H$$

$$C6N = I\bar{B}+\bar{I}B+A+\overline{\bar{C}B}+\overline{\bar{E}D}+\overline{\bar{G}F}+\overline{\bar{I}H}+\bar{K}J$$

$$C7N = I\bar{B}+\bar{I}B+A+\overline{\bar{C}B}+\overline{\bar{E}D}+\overline{\bar{G}F}+\overline{\bar{I}H}+\overline{\bar{K}J}+\bar{M}L$$

$$C8N = I\bar{B}+\bar{I}B+A+\overline{\bar{C}B}+\overline{\bar{E}D}+\overline{\bar{G}F}+\overline{\bar{I}H}+\overline{\bar{K}J}+\overline{\bar{M}L}$$

where C2N, C3N, C4N, C5N, C6N, C7N, C8N are carry logic signals, I is an increment signal and A, B, C, D, E, F, G, H, I, J, K, L and M are output signals.

24. A Gray code counter as in claim 1 wherein eighteen or nineteen bit expressions are processed, said carry logic circuit comprising logic means configured for providing carry logic signals in accordance with the logic equations $$C2N = I\bar{B}+\bar{I}B+A+\bar{C}B$$

$$C3N = I\bar{B}+\bar{I}B+A+\overline{\bar{C}B}+\bar{E}D$$

$$C4N = I\bar{B}+\bar{I}B+A+\overline{\bar{C}B}+\overline{\bar{E}D}+\bar{G}F$$

$$C5N = I\bar{B}+\bar{I}B+A+\overline{\bar{C}B}+\overline{\bar{E}D}+\overline{\bar{G}F}+\bar{I}H$$

$$C6N = I\bar{B}+\bar{I}B+A+\overline{\bar{C}B}+\overline{\bar{E}D}+\overline{\bar{G}F}+\overline{\bar{I}H}+\bar{K}J$$

$$C7N = I\bar{B}+\bar{I}B+A+\overline{\bar{C}B}+\overline{\bar{E}D}+\overline{\bar{G}F}+\overline{\bar{I}H}+\overline{\bar{K}J}+\bar{M}L$$

$$C8N = I\bar{B}+\bar{I}B+A+\overline{\bar{C}B}+\overline{\bar{E}D}+\overline{\bar{G}F}+\overline{\bar{I}H}+\overline{\bar{K}J}+\overline{\bar{M}L}+\bar{O}N$$

$$C9N = I\bar{B}+\bar{I}B+A+\overline{\bar{C}B}+\overline{\bar{E}D}+\overline{\bar{G}F}+\overline{\bar{I}H}+\overline{\bar{K}J}+\overline{\bar{M}L}+\overline{\bar{O}N}$$

where C2N, C3N, C4N, C5N, C6N, C7N, C8N, C9N are carry logic signals, I is an increment signal and A, B, C, D, E, F, G, H, I, J, K, L, M, N and O are output signals.

25. A Gray code counter as in claim 1 wherein twenty or twenty-one bit expressions are processed, said carry logic circuit comprising logic means configured for providing carry logic signals in accordance with the logic equations $$C2N = I\bar{B}+\bar{I}B+A+\bar{C}B$$

$$C3N = I\bar{B}+\bar{I}B+A+\overline{\bar{C}B}+\bar{E}D$$

$$C4N = I\bar{B}+\bar{I}B+A+\overline{\bar{C}B}+\overline{\bar{E}D}+\bar{G}F$$

$$C5N = I\bar{B}+\bar{I}B+A+\overline{\bar{C}B}+\overline{\bar{E}D}+\overline{\bar{G}F}+\bar{I}H$$

$$C6N = I\bar{B}+\bar{I}B+A+\overline{\bar{C}B}+\overline{\bar{E}D}+\overline{\bar{G}F}+\overline{\bar{I}H}+\bar{K}J$$

$$C7N = I\bar{B}+\bar{I}B+A+\overline{\bar{C}B}+\overline{\bar{E}D}+\overline{\bar{G}F}+\overline{\bar{I}H}+\overline{\bar{K}J}+\bar{M}L$$

$$C8N = I\bar{B}+\bar{I}B+A+\overline{\bar{C}B}+\overline{\bar{E}D}+\overline{\bar{G}F}+\overline{\bar{I}H}+\overline{\bar{K}J}+\overline{\bar{M}L}+\bar{O}N$$

$$C9N = I\bar{B}+\bar{I}B+A+\overline{\bar{C}B}+\overline{\bar{E}D}+\overline{\bar{G}F}+\overline{\bar{I}H}+\overline{\bar{K}J}+\overline{\bar{M}L}+\overline{\bar{O}N}+\bar{O}P$$

$$C10N = I\bar{B}+\bar{I}B+A+\overline{\bar{C}B}+\overline{\bar{E}D}+\overline{\bar{G}F}+\overline{\bar{I}H}+\overline{\bar{K}J}+\overline{\bar{M}L}+\overline{\bar{O}N}+\overline{\bar{O}P}$$

where C2N, C3N, C4N, C5N, C6N, C7N, C8N, C9N, C10N are carry logic signals, I is an increment signal and A, B, C, D, E, F, G, H, I, J, K, L, M, N, O, P and Q are output signals.

26. A Gray code counter as in claim 1 wherein twenty-two or twenty-three bit expressions are processed, said carry logic circuit comprising logic means configured for providing carry logic signals in accordance with the logic equations $$C2N = I\overline{B} + \overline{I}B + A + \overline{CB}$$
$$C3N = I\overline{B} + \overline{I}B + A + \overline{CB} + \overline{ED}$$
$$C4N = I\overline{B} + \overline{I}B + A + \overline{CB} + \overline{ED} + \overline{GF}$$
$$C5N = I\overline{B} + \overline{I}B + A + \overline{CB} + \overline{ED} + \overline{GF} + \overline{IH}$$
$$C6N = I\overline{B} + \overline{I}B + A + \overline{CB} + \overline{ED} + \overline{GF} + \overline{IH} + \overline{KJ}$$
$$C7N = I\overline{B} + \overline{I}B + A + \overline{CB} + \overline{ED} + \overline{GF} + \overline{IH} + \overline{KJ} + \overline{ML}$$
$$C8N = I\overline{B} + \overline{I}B + A + \overline{CB} + \overline{ED} + \overline{GF} + \overline{IH} + \overline{KJ} + \overline{ML} + \overline{ON}$$
$$C9N = I\overline{B} + \overline{I}B + A + \overline{CB} + \overline{ED} + \overline{GF} + \overline{IH} + \overline{KJ} + \overline{ML} + \overline{ON} + \overline{QP}$$
$$C10N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR}$$
$$C11N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR}$$

where C2N, C3N, C4N, C5N, C6N, C7N, C8N, C9N, C10N, C11N are carry logic signals, I is an increment signal and A, B, C, D, E, F, G, H, I, J, K, L, M, N, O, P, Q, R and S are output signals.

27. A Gray code counter as in claim 1 wherein twenty-four or twenty-five bit expressions are processed, said carry logic circuit comprising logic means configured for providing carry logic signals in accordance with the logic equations $$C2N = I\overline{B} + \overline{I}B + A + \overline{CB}$$
$$C3N = I\overline{B} + \overline{I}B + A + \overline{CB} + \overline{ED}$$
$$C4N = I\overline{B} + \overline{I}B + A + \overline{CB} + \overline{ED} + \overline{GF}$$
$$C5N = I\overline{B} + \overline{I}B + A + \overline{CB} + \overline{ED} + \overline{GF} + \overline{IH}$$
$$C6N = I\overline{B} + \overline{I}B + A + \overline{CB} + \overline{ED} + \overline{GF} + \overline{IH} + \overline{KJ}$$
$$C7N = I\overline{B} + \overline{I}B + A + \overline{CB} + \overline{ED} + \overline{GF} + \overline{IH} + \overline{KJ} + \overline{ML}$$
$$C8N = I\overline{B} + \overline{I}B + A + \overline{CB} + \overline{ED} + \overline{GF} + \overline{IH} + \overline{KJ} + \overline{ML} + \overline{ON}$$
$$C9N = I\overline{B} + \overline{I}B + A + \overline{CB} + \overline{ED} + \overline{GF} + \overline{IH} + \overline{KJ} + \overline{ML} + \overline{ON} + \overline{QP}$$
$$C10N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR}$$
$$C11N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT}$$
$$C12N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT}$$

where C2N, C3N, C4N, C5N, C6N, C7N, C8N, C9N, C10N, C11N, C12N are carry logic signals, I is an increment signal and A, B, C, D, E, F, G, H, I, J, K, L, M, N, O, P, Q, R, S, T and U are output signals.

28. A Gray code counter as in claim 1 wherein twenty-six or twenty-seven bit expressions are processed, said carry logic circuit comprising logic means configured for providing carry logic signals in accordance with the logic equations $$C2N = I\overline{B} + \overline{I}B + A + \overline{CB}$$
$$C3N = I\overline{B} + \overline{I}B + A + \overline{CB} + \overline{ED}$$
$$C4N = I\overline{B} + \overline{I}B + A + \overline{CB} + \overline{ED} + \overline{GF}$$
$$C5N = I\overline{B} + \overline{I}B + A + \overline{CB} + \overline{ED} + \overline{GF} + \overline{IH}$$
$$C6N = I\overline{B} + \overline{I}B + A + \overline{CB} + \overline{ED} + \overline{GF} + \overline{IH} + \overline{KJ}$$
$$C7N = I\overline{B} + \overline{I}B + A + \overline{CB} + \overline{ED} + \overline{GF} + \overline{IH} + \overline{KJ} + \overline{ML}$$
$$C8N = I\overline{B} + \overline{I}B + A + \overline{CB} + \overline{ED} + \overline{GF} + \overline{IH} + \overline{KJ} + \overline{ML} + \overline{ON}$$
$$C9N = I\overline{B} + \overline{I}B + A + \overline{CB} + \overline{ED} + \overline{GF} + \overline{IH} + \overline{KJ} + \overline{ML} + \overline{ON} + \overline{QP}$$
$$C10N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR}$$
$$C11N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT}$$
$$C12N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT} + \overline{WV}$$
$$C13N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT} + \overline{WV}$$

where C2N, C3N, C4N, C5N, C6N, C7N, C8N, C9N, C10N, C11N, C12N, C13N are carry logic signals, I is an increment signal and A, B, C, D, E, F, G, H, I, J, K, L, M, N, O, P, Q, R, S, T, U, V and W are output signals.

29. A Gray code counter as in claim 1 wherein twenty-eight or twenty-nine bit expressions are processed, said carry logic circuit comprising logic means configured for providing carry logic signals in accordance with the logic equations $$C2N = I\overline{B} + \overline{I}B + A + \overline{CB}$$
$$C3N = I\overline{B} + \overline{I}B + A + \overline{CB} + \overline{ED}$$
$$C4N = I\overline{B} + \overline{I}B + A + \overline{CB} + \overline{ED} + \overline{GF}$$
$$C5N = I\overline{B} + \overline{I}B + A + \overline{CB} + \overline{ED} + \overline{GF} + \overline{IH}$$
$$C6N = I\overline{B} + \overline{I}B + A + \overline{CB} + \overline{ED} + \overline{GF} + \overline{IH} + \overline{KJ}$$
$$C7N = I\overline{B} + \overline{I}B + A + \overline{CB} + \overline{ED} + \overline{GF} + \overline{IH} + \overline{KJ} + \overline{ML}$$
$$C8N = I\overline{B} + \overline{I}B + A + \overline{CB} + \overline{ED} + \overline{GF} + \overline{IH} + \overline{KJ} + \overline{ML} + \overline{ON}$$
$$C9N = I\overline{B} + \overline{I}B + A + \overline{CB} + \overline{ED} + \overline{GF} + \overline{IH} + \overline{KJ} + \overline{ML} + \overline{ON} + \overline{QP}$$
$$C10N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR}$$
$$C11N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT}$$
$$C12N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT} + \overline{WV}$$
$$C13N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT} + \overline{WV} + \overline{YX}$$
$$C14N = I\overline{B} + \overline{I}B + A + \overline{CB} + \overline{ED} + \overline{GF} + \overline{IH} + \overline{KJ} + \overline{ML} + \overline{ON} + \overline{QP} + \overline{SR} + \overline{UT} + \overline{WV} + \overline{YX}$$

where C2N, C3N, C4N, C5N, C6N, C7N, C8N, C9N, C10N, C11N, C12N, C13N, C14N are carry logic signals, I is an increment signal and A, B, C, D, E, F, G, H, I, J, K, L, M, N, O, P, Q, R, S, T, U, V, W, X and Y are output signals.

30. A Gray code counter as in claim 1 wherein thirty or thirty-one bit expressions are processed, said carry logic circuit comprising logic means configured for providing carry logic signals in accordance with the logic equations $$C2N = I\overline{B}+\overline{I}B+A+\overline{CB}$$
$$C3N = I\overline{B}+\overline{I}B+A+\overline{CB}+\overline{ED}$$
$$C4N = I\overline{B}+\overline{I}B+A+\overline{CB}+\overline{ED}+\overline{GF}$$
$$C5N = I\overline{B}+\overline{I}B+A+\overline{CB}+\overline{ED}+\overline{GF}+\overline{IH}$$
$$C6N = I\overline{B}+\overline{I}B+A+\overline{CB}+\overline{ED}+\overline{GF}+\overline{IH}+\overline{KJ}$$
$$C7N = I\overline{B}+\overline{I}B+A+\overline{CB}+\overline{ED}+\overline{GF}+\overline{IH}+\overline{KJ}+\overline{ML}$$
$$C8N = I\overline{B}+\overline{I}B+A+\overline{CB}+\overline{ED}+\overline{GF}+\overline{IH}+\overline{KJ}+\overline{ML}+\overline{ON}$$
$$C9N = I\overline{B}+\overline{I}B+A+\overline{CB}+\overline{ED}+\overline{GF}+\overline{IH}+\overline{KJ}+\overline{ML}+\overline{ON}+\overline{QP}$$
$$C10N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}$$
$$C11N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$$
$$C12N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}$$
$$C13N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}$$
$$C14N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}+\overline{Q_{27}Z}$$
$$C15N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}+\overline{Q_{27}Z}$$

where C2N, C3N, C4N, C5N, C6N, C7N, C8N, C9N, C10N, C11N, C12N, C13N, C14N, C15N are carry logic signals, I is an increment signal and A, B, C, D, E, F, G, H, I, J, K, L, M, N, O, P, Q, R, S, T, U, V, W, X, Y and $Q_{27}Z$ are output signals.

31. A Gray code counter as in claim 1 wherein thirty-two bit expressions are processed, said carry logic circuit comprising logic means configured for providing carry logic signals in accordance with the logic equations $$C2N = I\overline{B}+\overline{I}B+A+\overline{CB}$$
$$C3N = I\overline{B}+\overline{I}B+A+\overline{CB}+\overline{ED}$$
$$C4N = I\overline{B}+\overline{I}B+A+\overline{CB}+\overline{ED}+\overline{GF}$$
$$C5N = I\overline{B}+\overline{I}B+A+\overline{CB}+\overline{ED}+\overline{GF}+\overline{IH}$$
$$C6N = I\overline{B}+\overline{I}B+A+\overline{CB}+\overline{ED}+\overline{GF}+\overline{IH}+\overline{KJ}$$
$$C7N = I\overline{B}+\overline{I}B+A+\overline{CB}+\overline{ED}+\overline{GF}+\overline{IH}+\overline{KJ}+\overline{ML}$$
$$C8N = I\overline{B}+\overline{I}B+A+\overline{CB}+\overline{ED}+\overline{GF}+\overline{IH}+\overline{KJ}+\overline{ML}+\overline{ON}$$
$$C9N = I\overline{B}+\overline{I}B+A+\overline{CB}+\overline{ED}+\overline{GF}+\overline{IH}+\overline{KJ}+\overline{ML}+\overline{ON}+\overline{QP}$$
$$C10N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}$$
$$C11N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}$$
$$C12N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}$$
$$C13N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}$$
$$C14N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}+\overline{Q_{27}Z}$$
$$C15N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}+\overline{Q_{27}Z}+\overline{Q_{29}Q_{28}}$$
$$C16N = I\overline{B}+\overline{I}B+A+\overline{CB}+\overline{ED}+\overline{GF}+\overline{IH}+\overline{KJ}+\overline{ML}+\overline{ON}+\overline{QP}+\overline{SR}+\overline{UT}+\overline{WV}+\overline{YX}+\overline{Q_{29}Q_{28}}+\overline{Q_{27}Z}$$

where C2N, C3N, C4N, C5N, C6N, C7N, C8N, C9N, C10N, C11N, C12N, C13N, C14N, C15N, C16N are carry logic signals, I is an increment signal and A, B, C, D, E, F, G, H, I, J, K, L, M, N, O, P, Q, R, S, T, U, V, W, X, Y, $Q_{27}Z$, $Q_{28}$ and $Q_{29}$ are output signals.

* * * * *